United States Patent
Böck

(10) Patent No.: US 6,716,712 B2
(45) Date of Patent: Apr. 6, 2004

(54) PROCESS FOR PRODUCING TWO DIFFERENTLY DOPED ADJACENT REGIONS IN AN INTEGRATED SEMICONDUCTOR

(75) Inventor: Josef Böck, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/054,441

(22) Filed: Jan. 22, 2002

(65) Prior Publication Data

US 2002/0132440 A1 Sep. 19, 2002

Related U.S. Application Data

(63) Continuation of application No. PCT/DE00/02293, filed on Jul. 13, 2000.

(30) Foreign Application Priority Data

Jul. 20, 1999 (DE) .......................................... 199 33 959

(51) Int. Cl.$^7$ ..................... H01L 21/331; H01L 21/425; H01L 21/22; H01L 21/38

(52) U.S. Cl. ...................... 438/369; 438/371; 438/373; 438/374; 438/376; 438/532; 438/549; 438/551

(58) Field of Search .................. 438/320, 364–367, 438/376, 377, 368, 554

(56) References Cited

U.S. PATENT DOCUMENTS 4,467,519 A * 8/1984 Glang et al. ............... 438/330

FOREIGN PATENT DOCUMENTS

| JP | 58 155 764 | 9/1983 |
|---|---|---|
| JP | 59 006 574 | 1/1984 |

OTHER PUBLICATIONS

Kameyama, S. et al.: "Base Link–Up Process Technology for Self–Aligned Double Diffusion Bipolar Transistors", IEEE, 1987, pp. 27–30.

Nakamae, M.: "Recent Progress and Future Prospect for VLSI Si Biopolar Transistors", IEEE, 1987, pp. 5–6.

Chen, T et al..: "An Advanced Bipolar Transistor with Self–aligned Ion–implanted Base and W/poly Emitter," IEEE, 1987, pp. 31–33.

Yamaguchi, T. et al.: "Process and Device Performance of a High–Speed Double Poly–Si Bipolar Technology Using Borosenic–Poly Process with Coupling–Base Implant", IEEE, vol. 35, No. 8, Aug. 1988, pp. 1247–1256.

(List continued on next page.)

*Primary Examiner*—John F Niebling
*Assistant Examiner*—Ron Pompey
(74) *Attorney, Agent, or Firm*—Laurence A. Greenberg; Werner H. Stemer; Ralph E. Locher

(57) ABSTRACT

During the production of integrated semiconductor structures, it is often necessary to differently dope immediately adjacent regions. A method is provided for producing two adjacent regions of a predetermined area in an integrated semiconductor, whereby a first region of the two adjacent regions includes a doping with a lower target concentration than a second region. The predetermined area of a semiconductor blank is doped with a dopant until a concentration of the dopant is obtained that is at least as high as the target concentration of the second region. A protective layer is applied to the second region, and the dopant is out-diffused from the first region until a concentration of dopant is obtained that corresponds to the target concentration of the first region.

12 Claims, 3 Drawing Sheets

OTHER PUBLICATIONS

Sugiyama, M. et al.: "A40GHz $f_T$ Si Bipolar Transistor LSI Technology", IEEE, 1989, pp. 9.1.1–9. 1.4.

Van der Velden, J. et al.: "Basic: An Advanced High–Performance Bipolar Process", IEEE, 1989, pp. 9.4. 1–9.4.4.

Shiba, T. et al.: "Base Peripheral Effects on High Performance Self–Aligned Bipolar Devices (SICOS)", Scripta Technica, Inc., 1990, pp. 100–105.

Hayden, J. D. et al.: "A New Technique for Forming a Shallow Link Base in a Double Polysilicon Bipolar Transistor", IEEE, 1994, pp. 63–68.

Park, J. et al.: "Ultrashallow $p_+$/n Junction Formation by 0.5–1 keV Ion Implantation", Japanese Journal of Applied Physics, vol. 37, No.11B, 1998, pp. L1376–L1378.

\* cited by examiner

PRIOR ART

PROCESS FOR PRODUCING TWO DIFFERENTLY DOPED ADJACENT REGIONS IN AN INTEGRATED SEMICONDUCTOR

CROSS-REFERENCE TO RELATED APPLICATION

This application is a continuation of copending International Application No. PCT/DE00/02293, filed Jul. 13, 2000, which designated the United States.

BACKGROUND OF THE INVENTION

1. Field of the Invention

The present invention relates to a process for producing two adjacent regions of a predetermined area in an integrated semiconductor with different doping, and to an integrated transistor that can be produced using that process. The present invention also relates using the process according to the invention for producing an integrated transistor.

In the production of integrated semiconductor structures, the problem often arises that immediately adjacent regions have to be doped differently. The problem of such different dopings and the solutions that known in the prior art are discussed below using a concrete example of an integrated transistor. However, it goes without saying that the process according to the invention can also be applied to different fields of application in semiconductor production, and is not intended to be restricted to producing integrated transistors.

A bipolar transistor known in the prior art in an integrated semiconductor includes an actual, active transistor. In this case, this includes three adjacent, differently doped areas of semiconductors, the emitter area, the base area and the collector area. Depending on the doping, a distinction is drawn between pnp transistors and npn transistors, the sequence of the letters identifying the sequence of the doping in the emitter, base and collector area.

Furthermore, a transistor arranged in an integrated circuit has further auxiliary structures which surround it and which are used to isolate the potentials and to lead the currents away from the active transistor area. The emitter area is connected, via an emitter contact normally made of polysilicon, to an emitter conductor track, for example made of aluminum. The base area is connected, via a base contact, to a base conductor track. Finally, the collector area is connected, via a so-called "buried layer" which is located underneath the other structures and an intermediate layer and a collector contact, to a collector conductor track. Various silicon oxide isolation layers and spacer insulators are used for electrically isolating the various electrically conductive structures.

The base track resistance, which is the resistance between the base and the base conductor track in bipolar transistors is, in addition to the transit frequency and the base collector capacitance, the critical transistor parameter that determines important characteristics of the transistor such as its maximum oscillation frequency, its gain, its minimum noise its gate delay times, etc. For example, it is true that:

$$f_{max} \approx \sqrt{\frac{f_T}{8\pi \cdot R_B \cdot C_{BC}}} \quad (1)$$

where:
$f_{max}$ is the maximum oscillation frequency,
$f_T$ is the transit frequency,
$R_B$ is the base resistance, and
$C_{BC}$ is the base collector capacitance;
Or $$F_{min} \approx 1 + \frac{1}{\beta} + \frac{f}{f_T}\sqrt{\frac{2 \cdot I_C}{V_T}R_B\left(1 + \frac{f_T^2}{\beta \cdot f^2}\right) + \frac{f_T^2}{\beta \cdot f^2}} \quad (2)$$

where:
$F_{min}$ is the minimum noise figure,
$\beta$ is the current gain,
f is the frequency,
$f_T$ is the transit frequency,
$I_C$ is the collector current,
$V_T$ is the thermal voltage, and
$R_B$ is the base resistance.

In the case of self-adjusting silicon bipolar transistors, the base resistance is substantially composed of three components, which are referred to below as $R_{B,i}$, $R_{B,e}$, and $R_{B,l}$. The inner component $R_{B,i}$ arises from the resistance of the base region in the active transistor underneath the emitter area. The external component $R_{B,e}$ describes the resistance of the polysilicon track which forms the base contact. $R_{B,l}$ constitutes the base resistance that is produced by a low-doped zone under the self-adjusting emitter base insulation, the spacer insulator on the active transistor. This region is referred to generally in the literature as the link region.

In order to reduce the base resistance, optimizations can be carried out on all three areas.

As a result of the progressive lateral scaling of the components, the internal component $R_{B,i}$ can be reduced more and more. The external component $R_{B,e}$ may likewise be reduced in size by lateral scaling or by using low-resistance materials (for example suicides). The link component therefore increasingly gains in importance for the overall base resistance. In order to reduce the resistance in the link region, it would be expedient to increase the conductivity of the silicon under the spacer by using a deliberate additional base doping.

FIGS. 1A–1D show the schematic process flow for forming the active base and the link region in the prior art production technologies. FIG. 1A shows the initial state of the semiconductor blank before the base doping. The emitter window 1, which is placed in the area of the subsequent active transistor, is normally structured using a dry etching technique. In addition to the emitter window, further structures of the semiconductor are illustrated, namely two isolation layers 2 and 3 and a polysilicon layer 4 that constitutes the polysilicon track that is formed as an external component of the base of the transistor to be formed. The isolation layer 2 can be applied, for example, using LOCOS (Local Oxidation of Silicon) technology, and the isolation layer 3 can be applied using TEOS technology.

Dopant implantation of the desired dopant is then carried out, as illustrated in FIG. 1B by the arrows identified by reference symbol 6. This leads to base doping 7a, which is located in the sub-base of the transistor 5 to be formed. The selected illustrative form of a bar in this case identifies a specific limiting level of base doping. Above the line 7a, the doping that is carried out by implantation is higher than a specific limiting level, that is to say a specific limiting concentration within the silicon. Below the line 7a, the doping is lower. With suitable selection of the limiting level, it is therefore possible to state, to a first approximation, that the doping reaches as far as the line 7a, for example.

The following step performed, during the production of a prior art transistor, is annealing the implantation damage that occurred during the dopant implantation. This annealing is normally carried out by a tempering step, in which the entire wafer is subjected to a defined increase in temperature. In the process, a reduction in the base doping takes place as a result of the outward diffusion of dopant, as illustrated in FIG. 1C by the arrow 8. The reduction in the base doping manifests itself in a shift of the limiting level of the base doping toward the surface, as illustrated by the line 7b.

A spacer 9 is then deposited onto the silicon exposed in the emitter window. This spacer 9 defines the regions of the base area located below it as link regions. The doping in the active base region and in the link region under the spacer 9 are thus identical in this previously known process.

In the prior art, various processes for increasing the specific base doping under the spacer 9 have already been proposed, and these processes may substantially be divided into two groups. The first group consists of processes having an additional local implantation in the link region, and the second group consists of processes for locally increasing the doping in the spacer area by means of diffusion from highly doped auxiliary layers.

In the case of the first group, the link area is deliberately implanted using conventional processes, by depositing dopants on the link area.

In this process, the active base area has to be covered. Masking with photoresist and using photolithography is not possible in the case of scaled components, because of the small width of the spacer of about only 200 nm. Use is therefore generally made of auxiliary layers, which are structured with self-adjusting processes in order to mask the active base area. The application and structuring of these layers constitutes a significant increase in the process complexity and therefore of the costs.

In addition, the auxiliary layers generally cannot be removed without influencing the active base region, for example, as a result of an etching step. In addition, the ion implantation into the link region additionally produces defects in the monosilicon, which then have to be annealed by tempering. In this case, undesirable diffusion of the dopants ("transient enhanced diffusion") occurs in the active transistor region, and, inter alia, leads to an enlargement of the base width and therefore to a decrease in the transit frequency.

The additional process outlay and the above-described negative effect on the active component are responsible for why local implantation has not been able to make progress as a process for reducing the link resistance and why local implantation has not come into use in currently existing prevailing production technologies.

In the case of the second group—the diffusion from the auxiliary layers—highly doped layers (for example polysilicon implanted with boron or borosilicate glass layers) have to be deposited on the emitter window. Spacers are then formed from these layers. Using a tempering step, dopant is then diffused out of the doped auxiliary layers into the monosilicon in the spacer area. The doped spacers are then removed and spacers for emitter base isolation are formed.

This process also has serious disadvantages. For example, the formation of the auxiliary spacers and their removal requires approximately twenty additional process steps. The tempering step for the outward diffusion of dopant from the auxiliary spacers also leads to the diffusion of the dopants into the active transistor region, and therefore to a change in the electrical characteristics of the active component. In addition, etching the auxiliary spacers leads to etching in the active transistor region. This process has not been able to make progress in production technologies either.

On the basis of the problems described above, therefore, deliberate local elevation of the dopant concentration under the spacer is therefore currently omitted in all of the known bipolar technologies. The dopant concentration under the spacer is therefore always the same as in the active transistor region and is already defined by the ion implantation for forming the active base.

SUMMARY OF THE INVENTION

It is accordingly an object of the invention to provide a process for producing two adjacent regions that have predetermined areas in an integrated semiconductor and that have different dopings, which overcome the above-mentioned disadvantages of the prior art methods of this general type.

In particular, it is an object of the invention to provide a process for deliberately providing a link region with a higher doping wherein the process can be carried out in a simple and cost-effective manner.

With the foregoing and other objects in view there is provided, in accordance with the invention, a process for producing a predetermined area with two adjacent regions in an integrated semiconductor such that a first region of the two adjacent regions has a target concentration of a dopant that is lower than a target concentration of the dopant in a second region of the two adjacent regions. The process includes steps of: applying a polysilicon layer to a semiconductor blank; forming a window in the polysilicon layer such that the window defines a predetermined area of the semiconductor blank; doping the predetermined area of the semiconductor blank with the dopant until a concentration of the dopant is at least as high as the target concentration of the second region; forming a spacer in a self-adjusting manner with respect to an edge of the window such that the spacer defines the second region; and diffusing the dopant outward from the first region until the concentration of the dopant corresponds to the target concentration of the first region.

In accordance with an added feature of the invention, the doping is performed by implantation.

In accordance with an additional feature of the invention, after the doping step and before forming the spacer, the predetermined area is tempered.

In accordance with another feature of the invention, the method includes performing outward diffusion by tempering until a concentration of the dopant corresponds to the target concentration of the second region.

In accordance with a further feature of the invention, the dopant is selected from the group consisting of boron, aluminum, gallium, indium, phosphorus, arsenic, and antimony.

In accordance with a further added feature of the invention, the step of diffusing the dopant outward is performed by tempering.

In accordance with a further additional feature of the invention, the predetermined area is the base area of a transistor.

In accordance with yet an added feature of the invention, the first region is a base region of an active transistor.

In accordance with yet an additional feature of the invention, the second region is provided as a link region between a base region and a polysilicon track.

In accordance with yet another feature of the invention, an integrated transistor is produced in which the second region forms a base area underneath a spacer surrounding an emitter; and the first region forms a base area under the emitter.

With the foregoing and other objects in view there is also provided, in accordance with the invention, an integrated transistor, that includes: an emitter, a collector, a base, a polysilicon layer provided as a base contact, and a spacer formed on the edge of the polysilicon layer and surrounding the emitter. The base has a base area under the spacer and a base area under the emitter. The base area under the spacer is more highly doped than the base area under the emitter. The base area under the spacer is formed in a self-adjusting manner in relation to the spacer.

The significant idea of the present invention therefore consists of first producing the high target concentration of dopant desired for the link region in the entire base area, that is to say in the active base and underneath the spacer. Then, the excess dopant is removed in the active base. The present process is, however, not restricted to producing transistors. Instead, it can be applied to all semiconductor structures in which two adjacent regions need to be given different dopings. The area of the higher target concentration of dopant is covered by a protective layer to prevent the subsequent outward diffusion of the dopant, as desired in the adjacent region.

Accordingly, the invention is initially directed to a process for producing two adjacent regions of predetermined areas in an integrated semiconductor. A first region of the two adjacent regions has a doping at a lower target concentration than a second region. The process according to the invention has the following steps: doping the predetermined area of a semiconductor blank with a dopant until the concentration of the dopant is at least as high as the target concentration of the second region; applying a protective layer to the second region; and diffusing the dopant outward from the first region until the concentration of the dopant corresponds to the target concentration of the first region.

In this case, a protective layer is understood to mean any layer that can be applied to the second region which prevents the dopant from being able to diffuse out of the second region during the subsequent outward diffusion of the dopant.

The term "region" is to be understood as a limited region in a semiconductor that consists of a homogeneous material and a laterally uniform dopant concentration. In the vertical direction, that is to say into the semiconductor, the doping changes, depending on the process used.

An "area" in the sense of the present invention is to be understood to mean a limited region which includes one or more regions as defined above.

A "semiconductor blank" should be understood to mean an arrangement of structures produced by a semiconductor process, the structures still being in the process of fabrication, that is to say not yet fully functional.

In order to avoid etching away additionally applied layers, as known in the prior art, the doping is preferably carried out by dopant implantation in which the dopants are accelerated as ions in an electric field and are deflected onto the substrate material. This process has the advantage of making the concentration and the position of the doped areas in the crystal structure of the doped region capable of being controlled very exactly.

In order to anneal any implantation damage which may have occurred in the predetermined doped area, after the doping and before the application of the protective layer, tempering of the predetermined area may be carried out, that is to say a deliberate increase in the temperature. Since outward diffusion of the dopant occurs, in such a case the implantation of dopant is preferably carried out until the dopant concentration is above the target concentration in the second region. It is therefore preferably desired for outward diffusion caused by the tempering to take place until the concentration of the dopant corresponds to the target concentration of the second region.

The dopant can be selected from the entire known spectrum of available dopants, preferably, for example, from boron, aluminum, gallium, indium, phosphorus, arsenic, and antimony. A conventional substance currently used for doping is boron, which has the advantage of exhibiting the highest electrical activation capacity (the concentration of atoms incorporated into the silicon lattice).

The outward diffusion of the dopant from the first region, following the application of the protective layer, is preferably likewise carried out by tempering.

As already explained above, the inventive process can be used for producing an extremely wide range of adjacent regions. The protective layer must also be adapted to it. In the case of a preferred process, namely to produce integrated transistors, the inventive process is used for the producing the base region of the transistor, and the protective layer can be, for example, a self-adjusting spacer, which isolates the emitter area from base contacts running laterally.

In a preferred embodiment, as explained, the predetermined area is the base area of a transistor. The first region is therefore the base region of the active transistor and the second region can be the link region between base region and polysilicon track.

The invention is further directed to a transistor with an emitter, collector, a base, and a spacer surrounding the emitter, in which the base area underneath the spacer is more highly doped than the base area under the emitter, and which can be produced in accordance with the process of the invention.

Such a transistor is distinguished from the transistors known in the prior art in the fact that the base exhibits differences in the doping between link region and the active base region. Additionally, higher and more precisely defined implantation in the link region can be carried out, as a result of the implantation technique used. Second, as a result of the undesired diffusion of the dopants that is no longer present, the base width can be maintained exactly, and in addition, can be kept small. A transistor with such desirable characteristics has hitherto not been known in the prior art. In particular, doping in the second region, that is to say in the link region, up to a concentration of more than $2 \times 10^{20}$ particles/cm$^3$ can be reached. The concentration preferably lies between $5 \times 10^{18}$ and $2 \times 10^{20}$ particles/cm$^3$, even more preferably between $1 \times 10^{19}$ and $2 \times 10^{20}$ particles/cm$^3$, and even more particularly can be between $1 \times 10^{20}$ and $2 \times 10^{20}$ particles/cm$^3$. By comparison, the first region, that is to say the active base region in the present case, has a typical concentration of $5 \times 10^{18}$ particles/cm$^3$. It goes without saying that the values specified, even if cited in relation to a transistor, can also be reached in other semiconductor structures that are produced in accordance with the inventive process.

The invention is also directed using the process to produce a transistor in which the base area underneath the spacer surrounding the emitter is more highly doped than the base area under the emitter.

The process for producing semiconductor structures has a series of advantages. As compared with the process that is currently used, and that does not permit selective doping of adjacent regions, there is virtually no increase in the process complexity and therefore no increase in the costs either. If a tempering step is needed following implantation, only the tempering to anneal crystal damage following the implantation is divided into two steps. Thus, no new installations or new materials are needed for the inventive process.

In addition, no additional link implantations are needed, which lead to increased diffusion in the active transistor region. In addition, the process is self-adjusting, since the spacer itself is used as a diffusion barrier, and therefore the additional doping can be achieved exactly in the link region located under the spacer. Finally, the process can be used universally, since it can be applied not only to transistors but also to other structures in semiconductors, and for example with respect to transistors, all of the currently self-adjusting silicon bipolar transistors can be produced in accordance with the process according to the invention.

Other features which are considered as characteristic for the invention are set forth in the appended claims.

Although the invention is illustrated and described herein as embodied in a process for the production of two differently doped adjacent regions in an integrated semiconductor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2A:
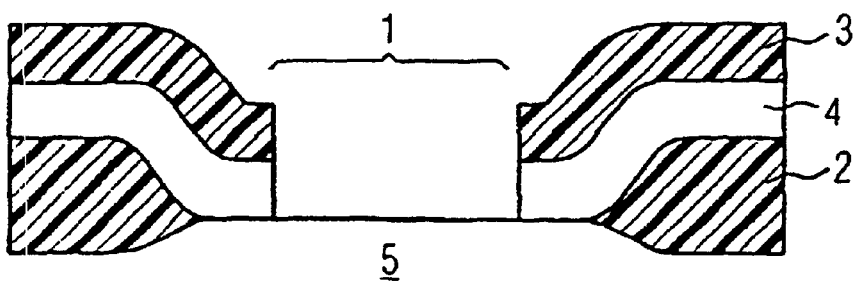
FIGS. 2A–2E show an inventive production process.

Referring now to the figures of the drawing in detail and first, particularly, to FIG. 2A thereof, there is shown an inventive schematic process flow for forming an active base and a link region.

Figure 1A:
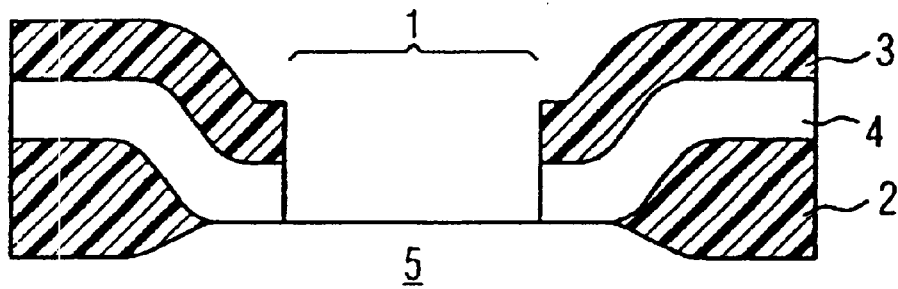
FIGS. 1A–1D show a production process for producing prior art transistors.
Figure 1B:
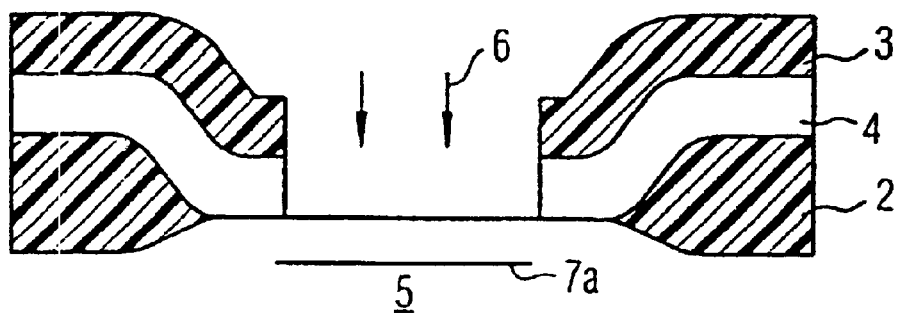
Figure 1C:
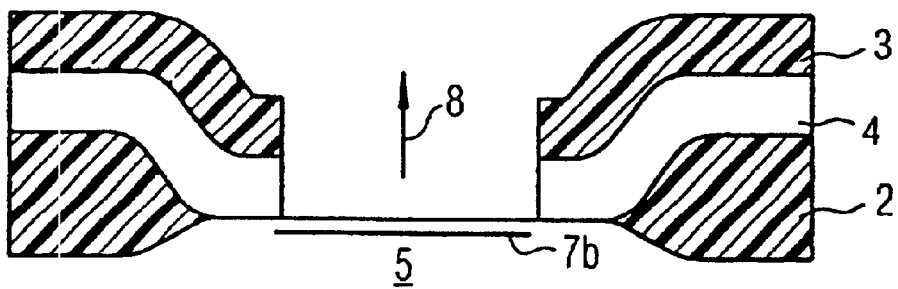
Figure 1D:
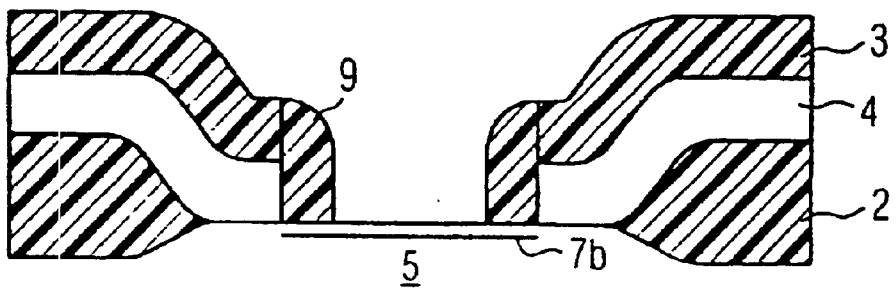
Figure 2B:
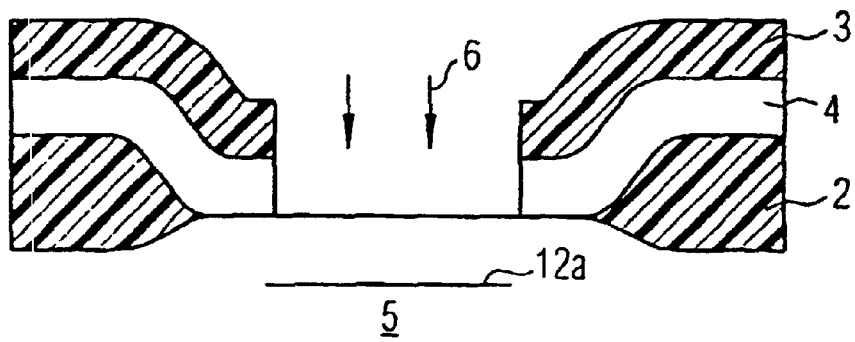
Figure 2C:
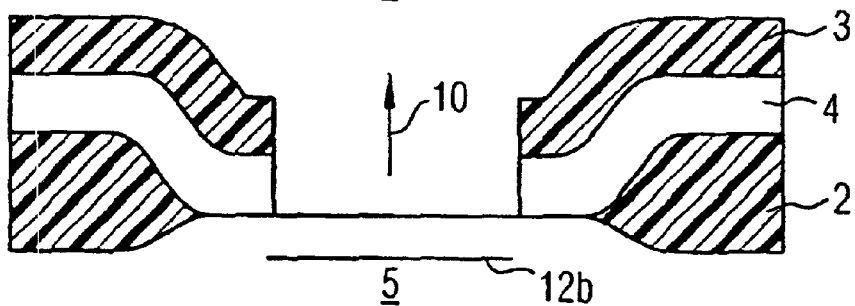

FIG. 2A corresponds to the illustration of FIG. 1A, in which identical structures have been provided with the same reference symbols. FIG. 2B shows the implantation of dopant which is indicated using the arrows 6 (see FIG. 2B). This implantation leads to a relatively high concentration of dopant 12a within the transistor sub-base 5. In the embodiment of the invention shown in FIGS. 2A–2E, a tempering step follows, which is shown in FIG. 2C. Outward diffusion, illustrated by arrow 10, occurs in the tempering step, and this outward diffusion leads to a reduction in the concentration of dopant (12b).

Figure 2D:
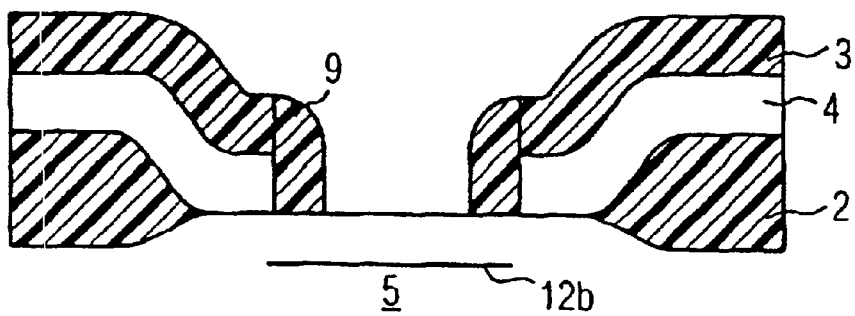

As shown in FIG. 2D, the spacer 9 is mounted in the emitter window 1 after the tempering step.

Figure 2E:
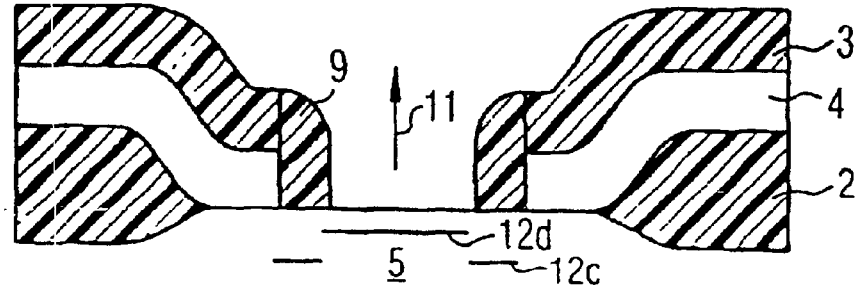

The second tempering step shown in FIG. 2E (arrow 11) then leads to a different target concentration of dopants in the transistor area 5. A lower dopant concentration 12d results in the actual active area of the base, and a higher dopant concentration 12c results in the link area underneath the spacer 9. In the link region, the dopant is enclosed by the spacer 9. The overall result is thereby a transistor, in which the doping in the spacer area is higher than in the active base area. One skilled in the art can also use the inventive process for producing other structures belonging to a semiconductor other than a transistor.

Figure 3:
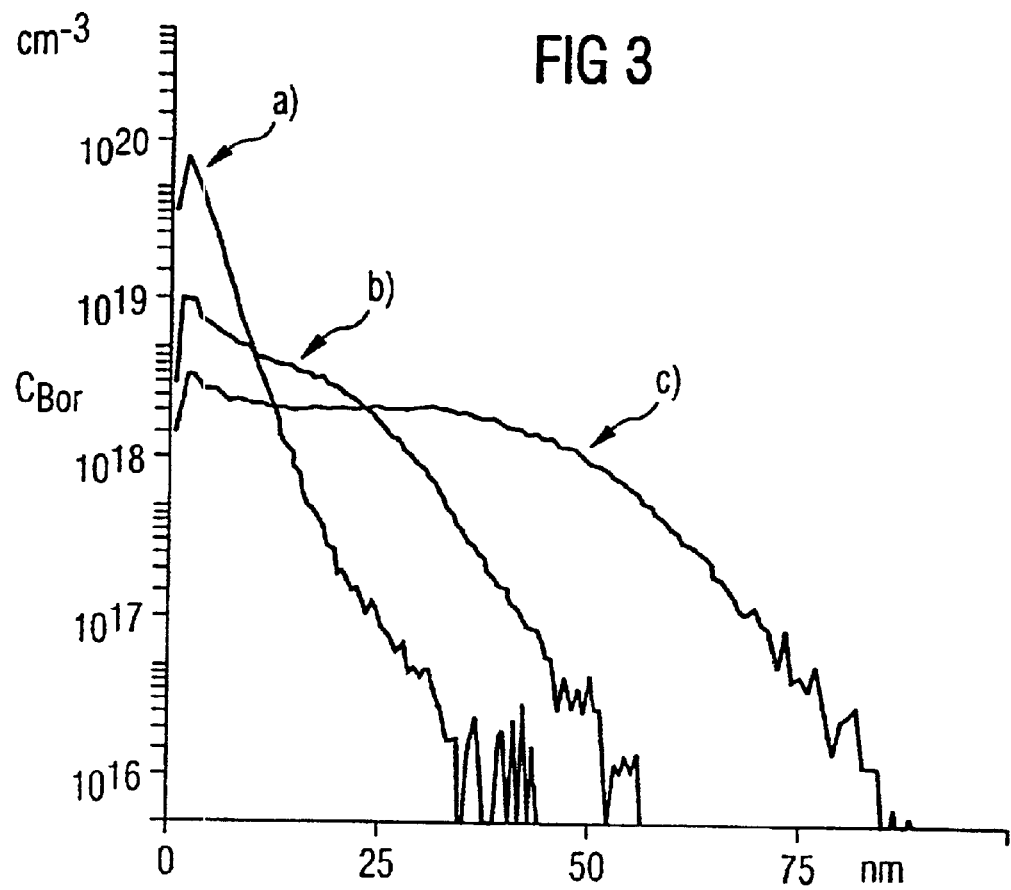
FIG. 3 shows the concentrations of dopant after the various process steps.

FIG. 3 shows experimental results on whole-area silicon wafers, in which the process for base doping was simulated. Dopant profiles measured by SIMS (secondary ion mass spectrometry) have been plotted. The penetration depth of the dopant in nanometers has been specified on the abscissa, and the concentration of the dopant, here boron, has been specified on the ordinate in particles/cm$^3$.

Curve a) shows the base doping immediately after the implantation. The doping after the first tempering in order to anneal the crystal defects is illustrated by curve b). Here, a first lowering of the dopant concentration directly at the surface by a factor of 10 already manifests itself. These dopant concentrations are maintained underneath the protective layer, since they are enclosed by the latter and are therefore conserved.

Curve c) results after a second tempering, and this therefore constitutes the doping in the first, more lowly doped region, for example in the active transistor region.

Figure 4:
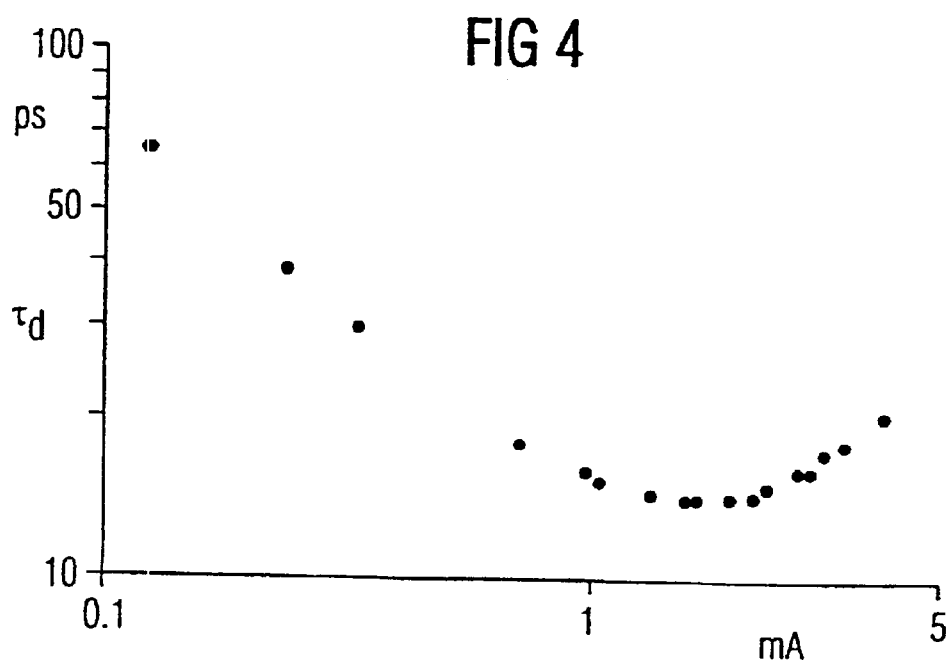
FIG. 4 shows the lattice delay times of the transistors that are produced in accordance with the inventive production process.

Transistors produced in accordance with the process of the invention are fully functional. In order to estimate the transistor performance, gate delay times of CML ring oscillators (current mode logic ring oscillators) were measured. The results of these measurements are illustrated in FIG. 4. The switching currents are illustrated on the abscissa, while the gate delay times in picoseconds are illustrated on the ordinate. As can be seen from FIG. 4, the result is minimum delay times of less than 15 psec, whereas in the case of conventionally produced transistors (such as the Siemens transistor B6HF), gate delay times of 25 psec are common.

I claim:

1. A process for producing a predetermined area with two adjacent regions in an integrated semiconductor such that a first region of the two adjacent regions has a target concentration of a dopant that is lower than a target concentration of the dopant in a second region of the two adjacent regions, the process which comprises:

applying a polysilicon layer to a semiconductor blank;

forming a window in the polysilicon layer such that the window defines a predetermined area of the semiconductor blank;

doping the predetermined area of the semiconductor blank with the dopant until a concentration of the dopant is at least as high as the target concentration of the second region;

forming a spacer in a self-adjusting manner with respect to an edge of the window such that the spacer defines the first region; and diffusing the dopant outward from the first region until the concentration of the dopant corresponds to the target concentration of the first region.

2. The process according to claim 1, which comprises performing the doping by implantation.

3. The process according to claim 2, which comprises: after the doping step and before forming the spacer, tempering the predetermined area.

4. The process according to claim 3, which comprises performing outward diffusion by tempering until a concentration of the dopant corresponds to the target concentration of the second region.

5. The process according to claim 1, wherein the dopant is selected from the group consisting of boron, aluminum, gallium, indium, phosphorus, arsenic, and antimony.

6. The process according to claim 1, wherein the step of diffusing the dopant outward is performed by tempering.

7. The process according to claim 1, which comprises providing the predetermined area as a base area of a transistor.

8. The process according to claim 7, which comprises providing the first region as a base region of an active transistor.

9. The process according to claim 8, which comprises providing the second region as a link region between a base region and a polysilicon track.

10. The process according to claim 7, which comprises providing the second region as a link region between a base region and a polysilicon track.

11. The process according to claim 1, which comprises: after the doping step and before forming the spacer, tempering the predetermined area.

12. The process according to claim 1, which comprises:

producing an integrated transistor, in which the second region forms a base area underneath a spacer surrounding an emitter; and the first region forms a base area under the emitter.

* * * * *